United States Patent [19]

Yanagisawa

[11] Patent Number: 4,806,457
[45] Date of Patent: Feb. 21, 1989

[54] METHOD OF MANUFACTURING INTEGRATED CIRCUIT SEMICONDUCTOR DEVICE

[75] Inventor: Masayuki Yanagisawa, Tokyo, Japan

[73] Assignee: NEC Corporation, Japan

[21] Appl. No.: 36,076

[22] Filed: Apr. 9, 1987

[30] Foreign Application Priority Data

Apr. 10, 1986 [JP] Japan ................................ 61-83480

[51] Int. Cl.$^4$ ................................................ G03C 5/00
[52] U.S. Cl. ...................................... 430/311; 430/30; 437/229
[58] Field of Search .......................... 430/311, 30, 494; 437/229; 356/384

[56] References Cited

U.S. PATENT DOCUMENTS

| | | | |
|---|---|---|---|
| 3,998,639 | 12/1976 | Feldman et al. | 430/30 |
| 4,200,396 | 4/1980 | Kleinknecht et al. | 356/384 |
| 4,330,213 | 5/1982 | Kleinknecht et al. | 356/355 |
| 4,408,884 | 10/1983 | Kleinknecht et al. | 356/355 |

Primary Examiner—José G. Dees
Attorney, Agent, or Firm—Laff, Whitesel, Conte & Saret

[57] ABSTRACT

A method of manufacturing integrated circuit semiconductor device in which a check pattern of resist film is formed for monitoring a state of an element-forming resist pattern having a narrow interval of 1.0 μm or less is disclosed. The check pattern is designed such that a plurality of resist stripes are arranged with intervals therebetween. Each of the intervals is of 1.0 μm or less and the width of the resist stripe is three times or more the interval.

6 Claims, 3 Drawing Sheets

METHOD OF MANUFACTURING INTEGRATED CIRCUIT SEMICONDUCTOR DEVICE

BACKGROUND OF THE INVENTION

The present invention relates to a method of manufacturing an integrated circuit semiconductor device, and more particularly to a lithography step in which a check pattern of a resist film is formed on a semiconductor wafer to monitor a state of an element-forming resist pattern provided on the semiconductor wafer.

In the lithography step for forming polycrystalline silicon gates or wirings, for example, a polycrystalline silicon film is entirely deposited on a field insulating layer and on gate insulating layers covering a silicon substrate, and a positive resist film of 1.0 μm to 2.0 μm thickness is entirely coated on the polycrystalline silicon film. The resist film is selectively irradiated with ultra-violet rays through a step-and-repeat reductive exposure system (wafer stepper). By conducting a development, the element-forming resist pattern is formed. Next, the polycrystalline silicon film is selectively etched by using the element-forming resist pattern as a mask, and the polycrystalline silicon gates and wirings are formed. In this case, if the shapes of the gates and wirings is incorrect caused by a bad element-forming resist pattern, the re-work is impossible no more. Therefore, before the etching process, the element-forming resist pattern must be checked to determine whether it has a desirable pattern or not. A desirable resist pattern is ought to be obtained if a precise optical mask or a precise reticle mask is used in the exposure process of ultra-violet rays. However, in practice, sometimes a resist stripe in the pattern is unfavorably contacted to a neighbor resist stripe, or else the resist stripe becomes unfavorably narrow width. These phenomena are caused by an undesirable amount of ultra-violet rays and/or conditions of the development, and therefore, they are monitored by providing a check pattern of the resist film. The check pattern and the element-forming resist pattern are simultaneously formed on the semiconductor substrate. Therefore, the state of element-forming resist pattern caused by conditions of exposure and development can be monitored by checking the check pattern with eyes of a worker. When the predetermined shape of the check pattern is not obtained, the resist film pattern including the element-forming pattern and the check pattern is removed to conduct a re-work of coating a new resist film, performing selective exposure of ultra-violet rays and development once more.

A check pattern in a prior art has a plurality of stripes arrayed in parallel, the width of each stripe and the interval between the stripes being designed to be equal.

If all intervals in the element-forming resist pattern are designed to be 2.0 μm or more, the check pattern of the resist can be designed such that the interval between the resist stripes in the check pattern substantially coincides with a minimum interval in the element-forming resist pattern, and when the interval in the check pattern is formed after development it can be confirmed that the minimum interval in the element-forming resist pattern would be formed without any unfavorable left resist part.

However, if the interval becomes 1 μm or less, the width of the resist stripes at both sides of the interval has an effect on the formation of the interval in the resist pattern. More particularly, when the width of the resist stripes is designed to be broad and the interval between the stripes is designed to be 1 μm or less, sometimes unfavorable resist part is left at the interval portion to short the resist stripes after development.

Therefore, even if a check resist pattern which is designed such that a plurality of resist stripes of 0.9 μm width are arranged in one direction with each constant interval of 0.9 μm is correctly formed after the development, an element-forming resist pattern which is designed such that two of resist stripes of 2.0 μm width for forming wirings or electrodes extend with a constant interval of 0.9 μm is sometimes not correctly formed after the development because the resist is left at the interval in the element-forming resist pattern and cannot be completely removed during the development. Thus, a part of resist is sometimes left to bridge the neighbouring two resist stripes. In that case, the check resist pattern in the prior art no more serves to monitor the state of the element-forming resist pattern. The true cause of this phenomenon has not been found yet. However, it could be supposed that when wide resist stripes are to be provided with a narrow interval of 1 μm or less, the lack of the flow of the developing solution occurs at the interval portion where the resist is to be removed and the resist is not completely removed from the interval portion.

SUMMARY OF THE INVENTION

Accordingly, an object of the present invention is to provide a method of manufacturing a semiconductor device in which an element-forming resist pattern having a narrow interval of 1 μm or less can be precisely monitored by a check pattern of the resist film.

Through extensive experiments, it has been confirmed by the inventor that if the width of the resist stripe in the check pattern is triple or more the width of the interval of 1 μm or less, the check pattern is useful for monitoring any circuit-forming resist pattern which contains very broad resist stripes with an interval of 1.0 μm or less. According to the present invention, a check resist pattern has at least two stripes arranged in parallel with an interval having a width w (for example 0.9 μm) and the width of each stripe is designed to be 3w (for example 2.7 μm) or more. Preferably, the length of the resist stripe in the check pattern is at least 10 times the interval thereof, that is, 10w or more.

For example, a check pattern of a resist film may comprise at least six resist stripes each having 5 μm width and 20 μm length and so arranged in parallel that intervals therebetween have different widthes of 1.0 μm, 0.9 μm, 0.8 μm, 0.7 μm and 0.6 μm. If an element-forming resist pattern having a minimum interval of 0.9 μm is formed on the same semiconductor substrate together with the check pattern, it can be confirmed that any unfavorable resist part is not left at the minimum interval portion of the element-forming resist pattern by observing that after development the intervals of 1.0 μm, 0.9 μm and 0.8 μm of the check pattern are not bridged. On the other hand, if the interval of 0.6 μm in the check pattern is bridged, it can be said that the resist stripe in the element-forming resist pattern is not unfavorably narrowered by excess exposure or excess development. Therefore, the gate electrode or wiring layer formed through etching process by using the element-forming resist pattern can maintain a predetermined width.

According to one feature of the present invention, there is provided a method of manufacturing an integrated circuit semiconductor device comprising a step of patterning a resist film to form an element-forming resist pattern and a check pattern for monitoring a state of the element-forming resist pattern, the check pattern being designed such that at least three resist stripes are arranged in parallel with interposing intervals, the intervals having different widths of 1 μm or less, and each of the resist stripes having a width of three times or more the maximum width of the intervals and a length of ten times or more the maximum width of the intervals. The intervals may be arranged in wider width order such that the difference between the width of one interval and that of the adjacent interval is 0.1 μm. All of the resist stripes may have the same width and the same length.

According to another feature of the present invention, there is provided a method of manufacturing an integrated circuit semiconductor device comprising a step of patterning a resist film to form an element-forming resist pattern and a check pattern for monitoring a state of said element forming resist pattern, the check pattern being designed such that a pair of resist stripes are extended in one direction with varying intervals. The interval has at least three sections of different widths of 1 μm or less, and each of the stripes has the width of three times or more the maximum interval width.

According to anther aspect of the present invention, there is provided a method of manufacturing an integrated circuit semiconductor device comprising a step of patterning a resist film to form an element-forming resist pattern and a check pattern for monitoring a state of the element-forming resist pattern, check pattern being designed such that first and second resist stripes extend in parallel with interposing an interval having a constant width of 1 μm or less, each of the first and second resist stripes being constituted by a plurality of portions each having different width, the width of one group of the portions being three times or more the constant width of the interval and the width of the other group of the portions being less than three times the constant width of the interval.

According to further another aspect of the present invention, there is provided a method of manufacturing an integrated circuit semiconductor device comprising a step of patterning a resist film to form an element-forming resist pattern and a check pattern for monitoring a state of the element-forming resist pattern, the check pattern being designed such that a plurality of resist stripes having different widths are arranged in parallel with interposing intervals having a constant width of 1 μm or less, and the minimum width of the stripes being less than three times the constant width of the interval and the maximum width of the stripes being not less than three times the constant width of the interval.

In the present invention, a negative type photo-resist may be used as well as a positive type photo-resist. However, a positive type resist is more effective in the present invention.

DESCRIPTION OF A PRIOR ART

Figure 1:
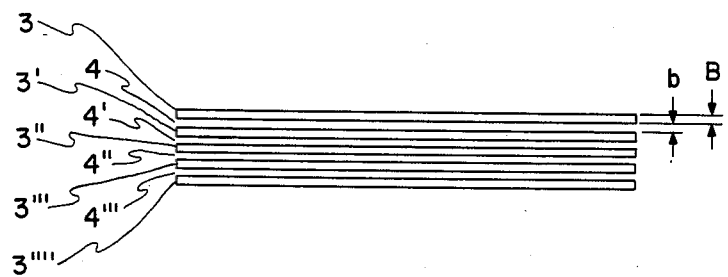
FIG. 1 is a plan via showing a check pattern in a prior art.

Referring to FIG. 1, a resist check pattern in a prior art is constituted by a plurality of resist stripes 3, 3', 3", 3'" and 3"" and intervals 4. 4', 4" and 4'". Each of resist stripes has the width B of 0.9 μm and each of intervals also has the width b of 0.9 μm. In this case, the pattern shown in FIG. 1 can be easily formed even if the width of the interval is 1.0 μm or less because of the narrow-width B of the resist stripe.

Figure 2B:
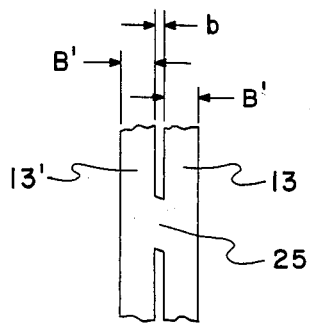
FIG. 2B is a plan view showing an unfavorable element-forming resist pattern.
Figure 2A:
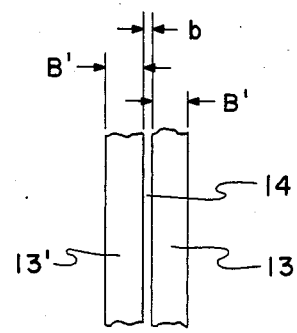
FIG. 2A is a plan view showing a desirable element-forming resist pattern.

However, an element-forming resist pattern is constituted by broader width resist stripes for forming, for example, polycrystalline silicon gates. In this case, even if the check pattern shown in FIG. 1 is formed and confirmed at a glance to be precise pattern, sometimes failures occur in the element-forming resist pattern. Therefore, the check pattern cannot be used no more for monitoring the state of the element forming resist pattern. More particularly, when a pair of resist stripes 13, 13' having the width B' of 3.0 μm are intended to be formed with an interval having the width b of 0.9 μm in an element-forming area as shown in FIG. 2A, even if the check pattern in FIG. 1 can be formed, sometimes a part of resist 25 is unfavorably left in the element-forming resist pattern.

DESCRIPTION OF THE EMBODIMENTS

Figure 3:
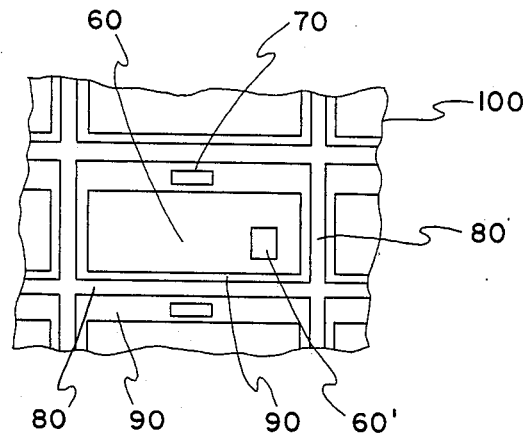
FIG. 3 is a plan view showing a part of a semiconductor wafer to which the present invention is applied.
Figures 4, 5B:
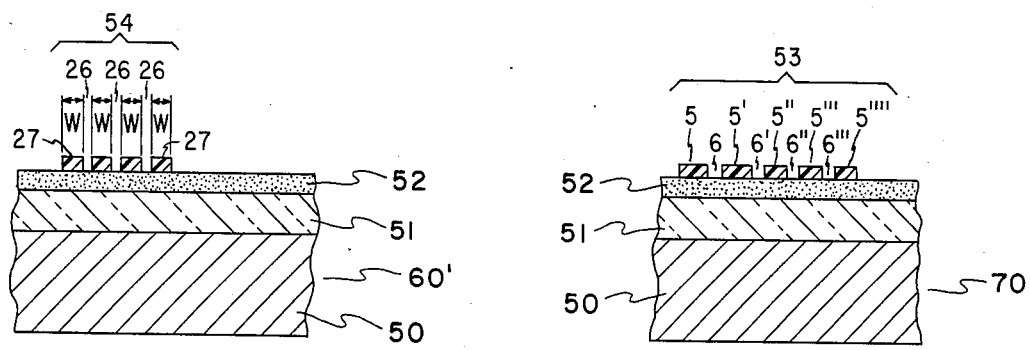
FIG. 4 is a cross-sectional view showing an element-forming resist pattern.
FIG. 5B is a cross-sectional view taken along line B—B' in FIG. 5A as viewed in the direction of arrows.
Figure 5A:
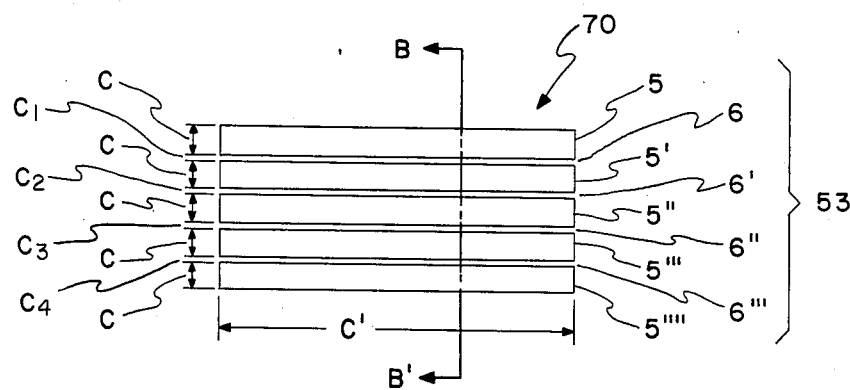
FIG. 5A is a plan view showing a check pattern of a first embodiment of the present invention.

Referring to FIG. 3, in a semiconductor wafer 100, a plurality of semiconductor pellets 90 are surrounded by scribe lines 80 and arranged in a matrix form. In each of semiconductor pellets 90, a check pattern forming area 70 and in element-forming area 60 are provided, and in a part 60' of the element-forming area 60, a plurality of polycrystalline silicon gate electrodes are to be formed. Referring to FIGS. 4 and 5B, an insulating film 51 is formed on a silicon substrate 50. The insulating film may be a field silicon oxide layer or else may be a gate insulating layer. A polycrystalline silicon film 52 is entirely deposited on the insulating film. After coating a positive type photo-resist film of 1 to 2 μm thickness on the entire surface of the polycrystalline silicon film, a selective exposure of ultra-violet rays is conducted to the resist film by a step-and-repeat reductive exposure system, that is, wafer stepper. Thereafter, the resist film is subjected to a developing process to form an element-forming resist pattern 54 and a check pattern 53 for monitoring a state of the element-forming resist pattern 54. In the developing process, the semiconductor wafer is dipped in developer such as TMAH (aqueous solutions of tetramethylammonium hydroxide) during 60 seconds under 25° C., and thereafter rinses through pure water and dryed.

The check pattern 53 of the first embodiment is designed such that it is constituted by five resist stripes 5, 5', 5'', 5''' and 5'''' and four intervals 6, 6', 6'' and 6'''. Each of the resist stripes has a same plan shape of C×C' in which C is 5 μm and C' is 60 μm. The widths of intervals have different value, that is, $C_l$ is 1.0 μm, $C_2$ being 0.9 μm, $C_3$ being 0.8 μm, $C_4$ being 0.7 μm. On the other hand, the element-forming resist pattern 54 is to be formed by four resist stripes 27 having the width W of 6.0 μm and three intervals 26 of 0.9 μm width. In this case, if the interval 6' having the gap width $C_2$ of 0.9 μm in the check pattern 53 is completely formed, that is, the resist in this portion is completely removed, it can be confirmed that the intervals 26 of 0.9 μm in the element-forming resist pattern 54 are satisfactorily formed. When a safety is considered to some extent, the interval 6'' having the gap width $C_3$ of 0.8 μm in the check pattern 53 is glanced whether the interval 6'' is completely formed. When the result of the monitoring is satisfying, the polycrystalline silicon film 52 is subjected to etching by using the element-forming resist pattern 54 as a mask and four silicon gate wiring layers are formed under the resist stripes 27 of the pattern 54.

Following second to fourth embodiments, only plan views of the check pattern of the resist film will be represented.

Figure 6:
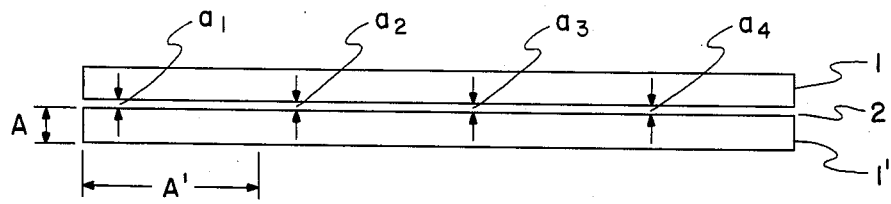
FIG. 6 is a plan view showing a check pattern of a second embodiment of the present invention.

Referring to FIG. 6, the check pattern of the resist film of the second embodiment is designed such that first and second resist stripes 1, 1'' extend with interposing a narrow interval 2. The interval 2 is divided four and the sections have different width $a_1$ to $a_4$ of 1 μm or less. In this embodiment, widths $a_1$, $a_2$, $a_3$ and $a_4$ are 1.0 μm, 0.9 μm, 0.8 μm and 0.7 μm, respectively. The second resist stripe 1' consists of four blocks, and each of blocks has the same rectangular shape of $A(=5 \mu m) \times A'(=25 \mu m)$. If in the element-forming resist pattern as shown in FIG. 4, the minimum intervals is 0.9 μm and the interval extends at a distance of 2 μm, and resist stripes at the both sides of the interval have broad width, the state of the element-forming resist pattern can be monitored by checking the interval $a_2$ of 0.9 μm. When the interval $a_2$ is formed, it is confirmed that any unfavorable bridged resist does not exist in the element-forming resist pattern. On the other hand, if the interval $a_4$ of 0.7 μm is completely formed, a occasion must be considered in which the resist stripes in the element-forming resist pattern for patterning gate wirings would become unfavorably narrow by excess exposure or excess development.

Figure 7A:
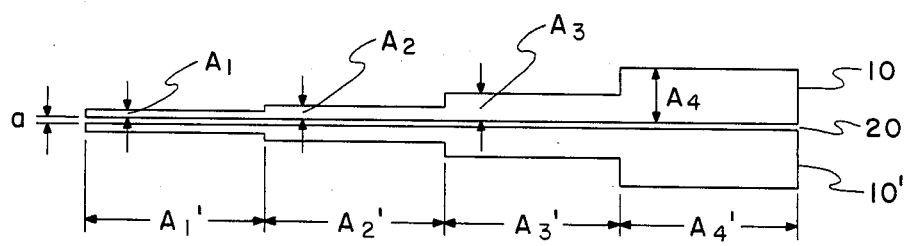
FIGS. 7A to 7C are plan views showing check patterns of a third embodiment of the present invention.

Referring to FIG. 7A, the check pattern of the third embodiment will be explained. First and second resist stripes 10, 10' extend in parallel with interposing an interval 20 having a constant width of 1 μm or less. Each of first and second resist stripes is constituted by four rectangular portions in which respective widths $A_1$, $A_2$, $A_3$ and $A_4$ are 1 μm, 2 μm, 4 μm and 8 μm, respectively, and respective lengths $A_1'$, $A_2'$, $A_3'$ and $A_4'$ are the same value of 25 μm. The formation of the interval 20 becomes difficult where the width of the resist stripe is broad For example, when the interval 20 between rectangular portions having the narrow widths $A_1$, $A_2$ could be formed, and the interval 20 between rectangular portions having the broad widths $A_3$, $A_4$ would be hardly formed, one can estimate that the lithography must be re-worked.

Figure 8:
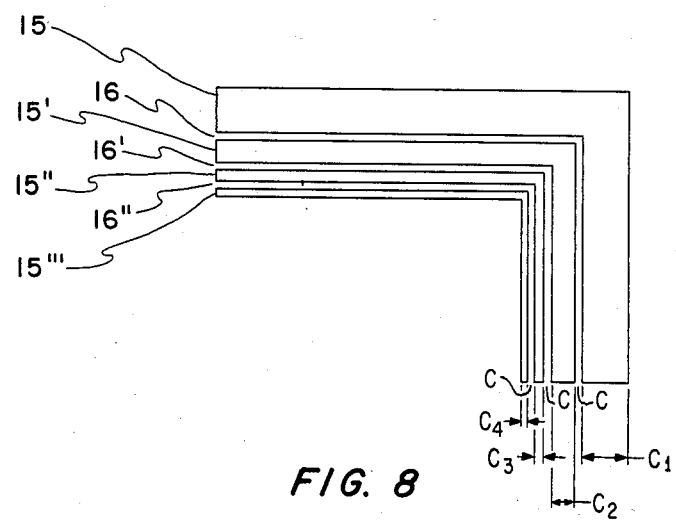
FIG. 8 is a plan view showing a check pattern of a fourth embodiment of the present invention.
Figure 7B:
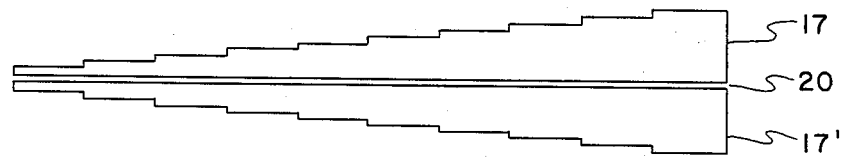
Figure 7C:
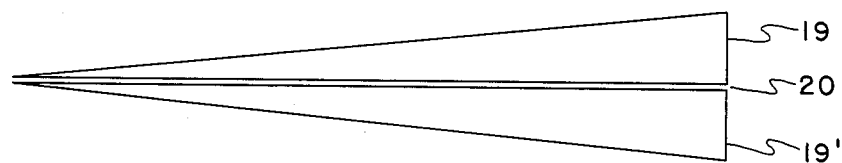

The resist stripes 17, 17' in FIG. 7B can be obtained by increasing the number of rectangular portions in FIG. 7A. The triangular shape in resist stripes 19, 19' of FIG. 7C is the final result by further increasing the number of rectangular portions Referring to FIG. 8, a check pattern of the fourth embodiment comprises four L type resist stripes 15, 15', 15'' and 15''' and three intervals 16, 16' and 16''. The widths $C_1$, $C_2$, $C_3$ and $C_4$ of the respective resist stripes are 8 μm, 4 μm, 2 μm and 1 μm respectively, and all of the intervals have the same width C of 0.9 μm.

What is claimed is:

1. A method of manufacturing an integrated circuit semiconductor device comprising a step of patterning a resist film by photolithographic technique to form an element-forming resist pattern and a check pattern for monitoring a state of said element-forming resist pattern, said check pattern being designed such that at least three resist stripes are arranged in parallel with interposing intervals, said intervals having different widths of 1μm or less, and each of said resist stripes having a width of three times or more the maximum width of said intervals and a length of ten times or more the maximum width of said intervals.

2. A method of claim 1, in which said resist stripes are four or more in number and widths of the intervals therebetween are successively reduced.

3. A method of claim 1, in which all of said resist stripes have the same width and the same length.

4. A method of manufacturing an integrated circuit semiconductor device comprising a step of patterning a resist film by photolithographic technique to form an element-forming resist pattern and a check pattern for monitoring a state of said element-forming resist pattern, said check pattern being designed such that a pair of resist stripes extend with interposing a narrow interval therebetween, said interval being divided at least three sections having different widths of 1μm or less, and each of said stripes having a width of three times or more the maximum width of said sections of said interval 5. A method of manufacturing an integrated circuit semiconductor device comprising a step of patterning a resist film by photolithographic technique to form an element-forming resist pattern and a check pattern for monitoring a state of said element-forming resist pattern, said check pattern being designed such that first and second resist stripes extend in parallel with interposing an interval having a constant width of 1 μm or less each of said first and second resist stripes being constituted by a plurality of portions each having different width, the width of one group of said portions being three times or more said constant width of said interval and the width of the other group of said portions being less than three times said constant width of said interval.

6. A method of manufacturing an integrated circuit semiconductor device comprising a step of patterning a resist film by photolithographic technique to form an element-forming resist pattern and a check pattern for monitoring a state of said element-forming resist pattern, said check pattern being designed such that a plurality of resist stripes having different widths are arranged with interposing intervals having a constant width of 1 μm or less, and the minimum width of said stripes being less than three times said constant width of said interval and the maximum width of said stripes being not less than three times said constant width of said interval.

* * * * *